(12) United States Patent  
Tanigawa

(10) Patent No.: US 6,784,014 B2  
(45) Date of Patent: Aug. 31, 2004

(54) SOLID-STATE IMAGING DEVICE

(75) Inventor: Kouichi Tanigawa, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/934,154

(22) Filed: Aug. 21, 2001

(65) Prior Publication Data

US 2002/0048840 A1 Apr. 25, 2002

(30) Foreign Application Priority Data

Aug. 22, 2000 (JP) .................................. P2000-251241

(51) Int. Cl.$^7$ ............................................. H01L 21/00
(52) U.S. Cl. ............................. 438/60; 438/65; 438/73; 438/75
(58) Field of Search .................... 257/225; 359/619; 438/24, 29, 60, 70, 75, 56, 65, 69, 73, 74

(56) References Cited

U.S. PATENT DOCUMENTS 5,593,913 A * 1/1997 Aoki ........................... 359/619
5,796,154 A * 8/1998 Sano et al. ................. 257/225
5,976,907 A * 11/1999 Shigeta et al. ............... 438/65

FOREIGN PATENT DOCUMENTS

JP         11-040787      *  2/1999 ........... H01L/27/14

* cited by examiner

*Primary Examiner*—W. David Coleman
(74) *Attorney, Agent, or Firm*—Robert J. Depke; Holland & Knight LLP

(57) ABSTRACT

A process for producing a solid-state imaging device which includes the steps of forming a light-receiving portion of a pixel in a surface region on the substrate, forming above the light receiving portion an inter-layer dielectric having a depression in its surface, forming on the inter-layer dielectric a light transmitting film having in its surface a concave conforming to the depression, forming at the position that covers the concave on the light transmitting film a mask layer with a convexly curved surface, and etching the mask layer and the light transmitting film all together, thereby making the light transmitting film into a shape of convex lens with an upwardly curved surface.

5 Claims, 10 Drawing Sheets

F I G. 1A
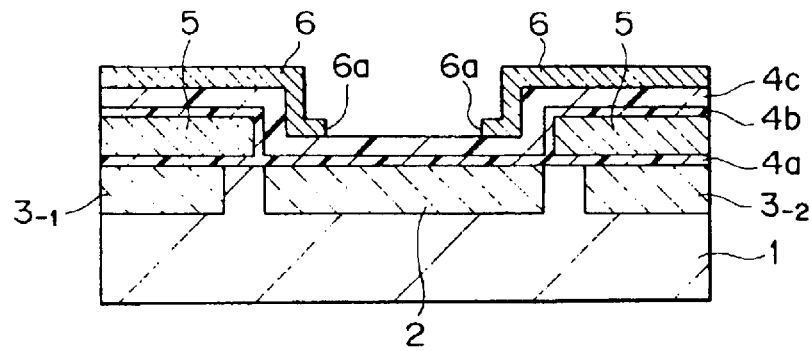
F I G. 1B
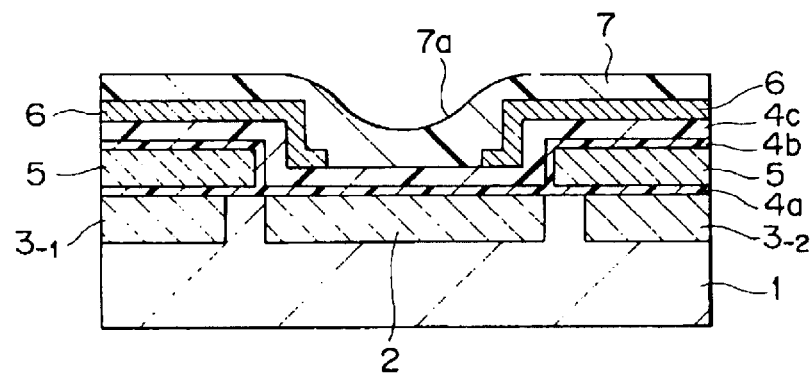
F I G. 1C
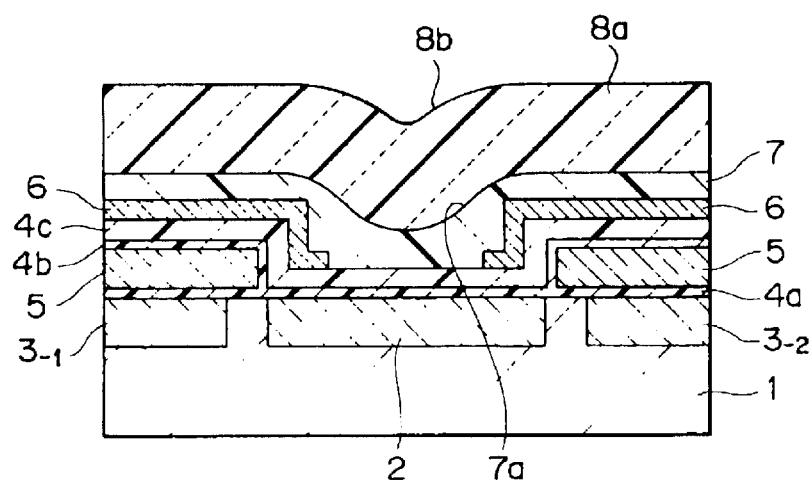

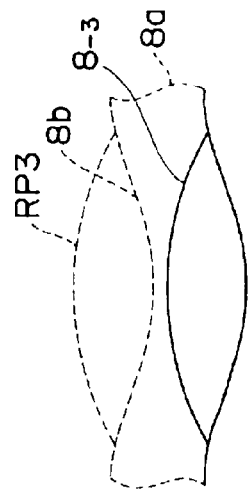
FIG. 4A-1
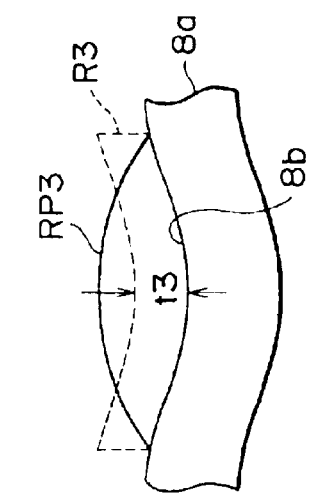
FIG. 4A-2
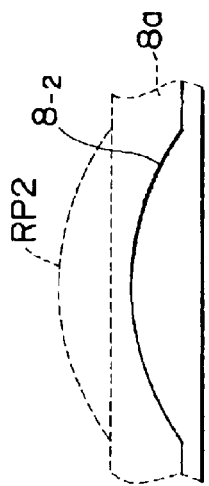
FIG. 4B-1
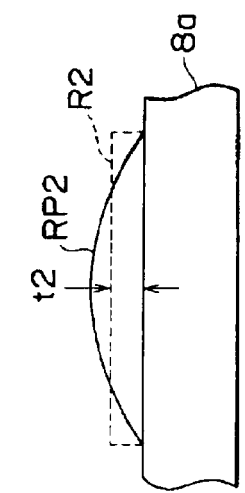
FIG. 4B-2
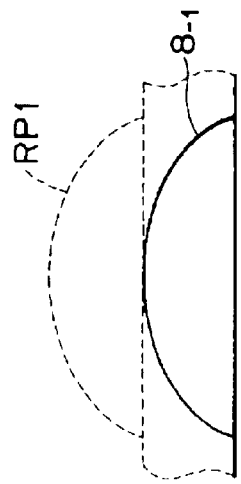
FIG. 4C-1
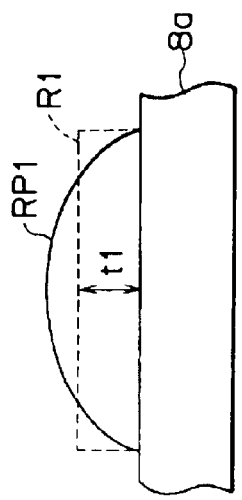
FIG. 4C-2

US 6,784,014 B2

SOLID-STATE IMAGING DEVICE

RELATED APPLICATION DATA

The present invention claims priority to Japanese Application No. P2000-251241, filed Aug. 22, 2000, which application is incorporated herein by reference to the extent permitted by law.

BACKGROUND OF THE INVENTION

The present invention relates to a solid-state imaging device and a process for production thereof, the solid-state imaging device being characterized in that each pixel has a convex lens with an upwardly curved surface which is embedded in an inter-layer dielectric between a light-receiving portion and an on-chip lens.

The CCD solid-state imaging device should desirably have a reduced chip size and an increased number of pixels. Unfortunately, this object is not achieved simply by reducing the chip size while leaving the current pixel size as it is because such an attempt ends up with a reduction in the number of pixels and hence a reduction in resolution. Nor is the object achieved simply by increasing the number of pixels while leaving the current pixel size as it is because such an attempt ends up with an increase in chip size and hence an increase in production cost and a decrease in yields.

Therefore, for reduction in chip size and for increase in the number of pixels, it is essential to reduce the pixel size from the current one. If this object is achieved, it is possible to provide a small-sized CCD imaging device which keeps the current resolution unchanged or conversely to improve resolution while keeping the current chip size unchanged.

The problem with reduction in pixel size is that the amount of light incident on a unit pixel decreases and the light-receiving portion of a unit pixel becomes poor in sensitivity characteristics. Although the second difficulty can be overcome by improving the photoelectric conversion efficiency with a concomitant adverse effect of amplifying noise components, the result is a decrease in S/N ratio of image signals output from the CCD imaging device. In other words, it is not desirable to compensate for the loss of sensitivity characteristics resulting from reduction in pixel size only with improvement in photo-electric conversion efficiency, but it is desirable to improve as much as possible the condensing efficiency of each pixel, thereby preventing the decrease in S/N ratio.

An idea contrived from the above-mentioned standpoint is to form an on-chip lens (OCL) on the color filter formed on the light-receiving portion. This idea, however, is not practicable for a CCD imaging device having a pixel size smaller than 4×4 µm, because the efficiency of condensing light with an on-chip lens alone has almost approached the upper limit. A new technology to overpass the limit has been proposed in Japanese Patent Laid-open No. Hei 11-40787. This technology is concerned with an additional convex lens in filmy form of light-transmitting material which is formed in the layer between the on-chip lens and the light-receiving portion. This additional convex lens is designed to improve further the efficiency of condensing light. According to the disclosure, the convex lens is formed by the process which is explained below with reference to FIGS. 6A to 7C. This process is referred to as "conventional process 1".

As shown in FIG. 6A, the process starts with fabrication of a silicon substrate 1 to form thereon the following components in the conventional way. A light-receiving portion 2, charge transfer portions $3_{-1}$ and $3_{-2}$, a gate portion (not shown) between the light-receiving portion 2 and the charge transfer portion $3_{-1}$, and a channel stopper (not shown) between the light-receiving portion 2 and the charge transfer portion $3_{-2}$. Transfer electrodes 5 are embedded in the insulating film 4 covering the charge transfer portions $3_{-1}$ and $3_{-2}$. On the insulating film 4 is formed a shielding film 6 of high-melting metal which has an opening above the light-receiving portion 2.

Then, a BPSG film 20 is formed on the shielding film 6 and the opening therein. The BPSG film 20 is planarized by reflowing as shown in FIG. 6B. On the planarized film 20 is formed a light-transmitting film 21a from silicon nitride (P-SiN) or silicon oxide (P-SiO$_2$) by plasma CVD as shown in FIG. 6C.

The light-transmitting film 21a is coated with a resist. The resist film is patterned such that a region around the center of the light-receiving portion 2 remains. The patterned resist undergoes reflowing, so that it softens and forms a convex lens (resist pattern RP) having a prescribed curvature, as shown in FIG. 7A.

Etching is performed under the condition that the resist and the light-transmitting film have almost the same selectivity. Etching removes the resist, while leaving the light-transmitting film in the form of convex lens 21. The shape of the convex lens 21 conforms well to the shape of the resist pattern RP, as shown in FIG. 7B.

Subsequently, the convex lens 21 is embedded in a planarizing film 9. Finally, an on-chip color filter (OCCF) 10 and an on-chip lens (OCL) 11 are formed in the usual way, as shown in FIG. 7C.

There is another process ("conventional process 2") in which the convex lens forming step in "conventional process 1" is modified as explained below.

FIGS 8A to 9C are sectional views showing "conventional process 2".

As shown in FIG. 8A, "conventional process 2" starts with fabrication of a silicon substrate 1 to form the following components thereon as in "conventional process 1". A light-receiving portion 2, charge transfer portions $3_{-1}$ and $3_{-2}$, an insulating film 4, transfer electrodes 5, and a shielding film 6.

A PSG film or BPSG film 22 is formed on the shielding film 6 and the opening therein. The PSG film or BPSG film undergoes reflowing. According to "conventional process 2", this reflowing does not achieve complete planarizing but forms a depression 22a above the light-receiving portion 2.

As shown in FIG. 8B, a light-transmitting film 23a of P-SiN or P-SiO$_2$ is formed on the PSG film or BPSG film 22. On the light-transmitting film 23a is formed resist R which is subsequently planarized.

Etching is performed under the condition that the resist R and the light-transmitting film 23a have almost the same selectivity. Etching forms the light transmitting film 23b, with its surface planarized, as shown in FIG. 8C.

As shown in FIG. 9A, a light transmitting film 23c is formed on the planarized surface. Then, a resist is applied to the light transmitting film 23c, and the resist film is patterned such that a region around the center of the light-receiving portion 2 remains. This patterning is following by reflowing. In this way there is obtained a resist pattern RP in the form of convex lens having a prescribed curvature.

Etching is performed again under the condition that the resist and the light-transmitting film have almost the same selectivity. Etching removes the resist, while leaving the light-transmitting film in the form of convex lens 23. The shape of the convex lens 23 conforms well to the shape of the resist pattern RP, as shown in FIG. 9B.

Finally, a planarizing film 9 is formed and an OCCF 10 and an OCL 11 are formed in the usual way, as shown in FIG. 9C.

The CCD imaging element obtained by "conventional process 1" and "conventional process 2" functions in the following way as shown in FIG. 10. The OCL 11 converges to some extent the incident ray (the vertical incident ray L0 and the oblique incident ray L1 with respect to the light-receiving plane). Another convex lens 21 (or 23) under the OCL 11 further converges the converged incident light. The converged light reaches the light-receiving portion 2. Thus, the convex lens 21 (or 23) improves the efficiency of condensing incident rays. The convex lens 21 (or 23) is particularly effective in condensing the oblique incident ray L1 indicated by broken lines in FIG. 10. This improves the sensitivity of each pixel.

"Conventional process 1" and "conventional process 2" which are designed to form the convex lens 21 or 22 under the OCL 11 have the disadvantage that the curvature of the surface of the convex lens 21 or 23 depends on the curvature of the surface of the resist to be used as a mask during processing. In other words, the curvature of the resist surface should be large if the curvature of the lens surface is to be large, and the curvature of the resist surface should be small if the curvature of the lens surface is to be small. This makes it necessary to optimize the resist thickness so that the lens surface has a desired curvature.

Unfortunately, forming the convex lens by "conventional process 1" or "conventional process 2" poses a problem that the resist thickness tends to vary as it is reduced in proportion to the pixel size. Uneven resist coating implies that the thickness of the convex lens and the curvature of the lens surface vary in the same chip or in the same wafer. This in turn results in uneven sensitivity, that is, the level of output signal varies from one pixel to another.

A conventional practice to address this problem was to apply the resist somewhat thick enough to avoid coating variation in the step of forming the convex lens.

Thick coating means that the shape of the convex lens deviates from the optimal value in the case where the pixel size is small. In other words, the convex lens 21 has an excessively large curvature of lens surface relative to the pixel size, as shown in FIG. 11. The large curvature of the lens surface moves the focus upward from the light-receiving plane, as shown in FIG. 11, with the result that light diverges on the light-receiving plane and the amount of light received decreases. For the vertical light L0 indicated by solid lines in FIG. 11, the amount of light received decreases rather slightly.

However, the amount of light received decreases remarkably when the ratio of oblique light L1 (relative to OCL 11) increases. This occurs when the camera equipped with the CCD imaging element in question has its lens stopper opened more (so that the F value is small). As indicated by broken lines in FIG. 11, a large portion of the light passing through the convex lens strikes the shielding film 6 outside the light-receiving plane. This results in a considerable decrease in pixel sensitivity.

Moreover, the light incident aslant on the opening 6a of the shielding film 6 undergoes irregular reflection by interfaces of different films under the shielding film 6, and the reflected light enters the vertical transport portion $3_{-1}$, thereby generating charges. The thus generated charges cause noise to the signal charges transferred from the vertical transfer portion $3_{-1}$, and what is worse, this noise accumulates at each time of transfer and manifests itself as smear in the image.

In summary, the convex lens formed by the conventional process poses a problem that sensitivity decreases and smear readily occurs when the pixel is reduced.

On the other hand, any attempt to reduce the curvature of the convex lens despite small pixel size results in variation in resist thickness. This in turn causes the convex lenses to vary in shape, with the result that pixel sensitivity varies in the same element or from one element to another and hence sensitivity varies in the same image.

One way to overcome this problem in the conventional CCD imaging element is to slightly increase the resist thickness for the convex lens although it somewhat causes smear and decreases sensitivity due to oblique incident rays.

Consequently, there has been a demand for a new technology which solves the above-mentioned problem. Such a new technology should be able to eliminate smear and keeps sensitivity for oblique incident rays even though the convex lens under the OCL has a small curvature for uniform sensitivity.

SUSMMARY OF THE INVENITON

It is an object of the present invention to provide a solid-state imaging device and a process for production thereof, the solid-state imaging device is characterized in that the convex lens has a small curvature for uniform sensitivity without loss in smear characteristics and decrease in sensitivity due to oblique incident rays.

The present invention is directed to an improved process for producing a solid-state imaging device including the steps of forming a light-receiving portion of a pixel in a region on the substrate surface, forming a convex lens with an upwardly curved surface which is embedded in an inter-layer dielectric above the light-receiving portion, and forming an on-chip lens above the convex lens, wherein the improvement includes forming sequentially the light-receiving portion, forming an inter-layer dielectric having a depression in its surface above the light-receiving portion, forming on the interlayer dielectric a light transmitting film having in its surface a concave conforming to the depression, forming at the position that covers the concave on the light transmitting film a mask layer with a convexly curved surface, and etching the mask layer and the light transmitting film all together, thereby making the light transmitting film into a shape of the convex lens.

Preferably, the process defined above further comprises, following the step of forming the light-receiving portion, the steps of forming electrodes to transfer charges generated by the light-receiving portion, the electrodes being positioned above both sides of the light-receiving portion and being insulated from the substrate, forming a shielding film which covers the step of the charge transfer electrodes and opens above the light-receiving portion, the shielding film being insulated from the charge transfer electrodes, and forming the inter-layer dielectric covering the shielding film and its opening in such a way that the depression is formed in the surface of the inter-layer dielectric in conformity with the step of the charge transfer electrode and the step of the shielding film.

Preferably, the process defined above further comprises, following the step of forming the light-receiving portion, the step of softening the inter-layer dielectric by heat treatment, thereby adjusting the depth of the depression.

Preferably, the process defined above further comprises the steps of forming a resist pattern (as the mask layer) on the light transmitting film and softening the resist pattern by heat treatment, thereby adjusting the curvature of the surface of the resist pattern.

Preferably, the process defined above includes etching which is carried out under the condition that the mask layer and the light transmitting film have almost the same selectivity.

Production of the solid-state imaging device by the process of the present invention offers the following advantage. The inter-layer dielectric has a depression and the light transmitting film has a concave which conforms to the depression. Owing to this structure, the resist applied to form a resist pattern on the light transmitting film can be made thicker than that in "conventional process 1" or "conventional process 2" in which a resist is applied onto a flat underlayer.

The consequence is that the curvature of the surface of the resist pattern can be made smaller than that in the conventional technology because an excess resist fills the concave when the resist is softened by heat treatment even though the resist thickness is large. Therefore, the solid-state imaging device produced by the process of the present invention differs from that produced by the conventional process in that the convex lens has a smaller curvature.

The process of the present invention needs only one step to form the convex lens from a single light transmitting film, whereas "conventional process 2" needs two steps to form the convex lens.

The present invention is directed to a solid-state imaging device having a light-receiving portion of a pixel formed in a region on the substrate surface, a convex lens with an upwardly curved surface which is positioned above the light-receiving portion and embedded in an inter-layer dielectric, and an on-chip lens formed above the convex lens, characterized in that the convex lens is formed on the depression in the surface of the underlying inter-layer dielectric such that the lower part of the lens which is made of the light transmitting material filling the depression is integral with the upper part of the lens which is made of the same light transmitting material as that of the lower part of the lens and has the convexly curved lens surface.

BRIEF DESCRIPTION OF THE DRAWINGS

FIGS. 1A to 1C are sectional views showing the steps (up to formation of the light transmitting film) in production of the solid-state imaging device pertaining to one embodiment of the present invention;

FIG. 4A–1 is a sectional view which was taken after the resist pattern RP1 with a large curvature had been formed by the conventional technology, FIG. 4A–2 is a sectional view which was taken after etching had been carried out with the help of resist pattern RP1 by the conventional technology, FIG. 4B–1 is a sectional view which was taken after the resist pattern RP2 with a small curvature had been formed by the conventional technology, FIG. 4B–2 is a sectional view which was taken after etching had been carried out with the help of resist pattern RP2 by the conventional technology, FIG. 4C–1 is a sectional view which was taken after the resist pattern RP3 with a small curvature had been formed in one embodiment of the present invention, FIG. 4C–2 is a sectional view which was taken after etching had been carried out with the help of resist pattern RP3 in one embodiment of the present invention;

DETAILED DESCRIPTION OF THE PREFERRED EMBODIMENT

The CCD solid-state imaging device pertaining to one embodiment of the present invention is characterized by an imaging portion (not shown) which has a plurality of vertical transfer portions extending parallel with each other in one direction (vertical transfer direction). In each space between adjacent transfer portions are arranged the light receiving portions of pixels forming a line. The line of the light receiving portions is parallel to the line of the transfer portions. Between one line of the light receiving portions and its adjacent line of the vertical transfer portions are arranged gate portions for respective pixels. In addition, between the line of the light receiving portions and its another adjacent line of the vertical transfer portions are arranged channel stoppers to prevent the signal charges generated by the light receiving portions from leaking to the other vertical transfer portions.

Figure 3A:
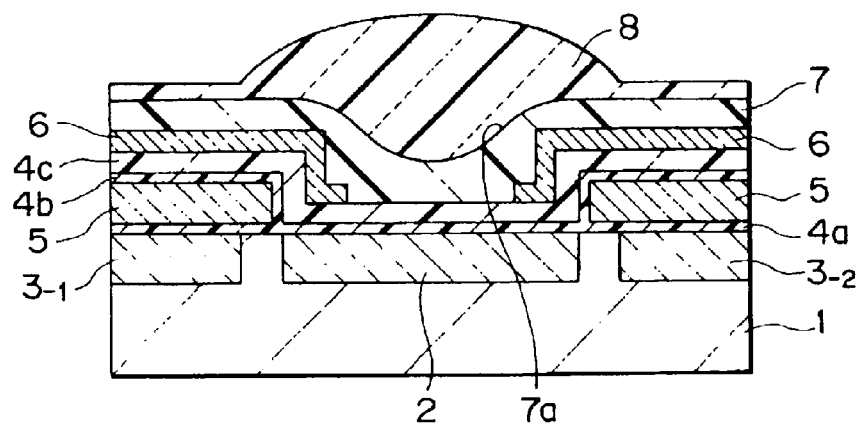
FIGS. 3A and 3B are sectional views showing the steps (up to formation of the OCL) in production of the solid-state imaging device pertaining to one embodiment of the present invention.
Figure 3B:
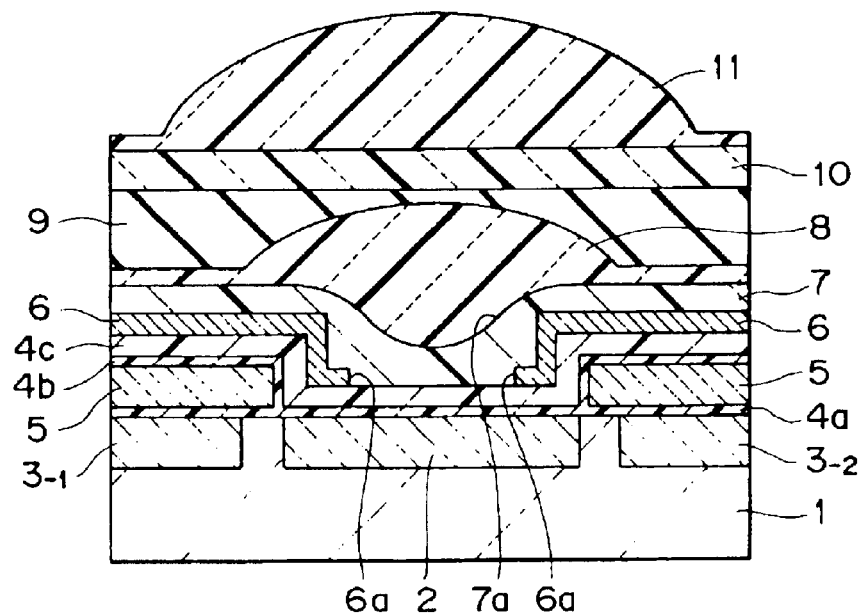

The CCD solid-state imaging device pertaining to one embodiment of the present invention has the imaging portion for one pixel as shown in section in FIG. 3B. This sectional view was taken along a line in the direction perpendicular to the vertical transfer direction of signal charges.

In FIG. 3B, there is shown a silicon substrate 1 or a p-type well formed on a silicon substrate. Both of them will be referred to simply as a substrate. In a surface region of the substrate 1 is formed a light receiving portion 2. The light receiving portion 2 has an n-type impurity region which forms a pn junction between it and the substrate 1. The region of pn junction performs photoelectric conversion, thereby generating signal charges, and stores signal charges for a prescribed period of time. At both sides of the light receiving portion 2 are formed (a certain distance apart) vertical transfer portions $3_{-1}$ and $3_{-2}$ of n-type impurity. Between the light receiving portion 2 and the vertical transfer portion $3_{-1}$ is formed a p-type impurity region (not shown) which forms a variable potential barrier for the reading gate. Between the light receiving portion 2 and the vertical transfer portion $3_{-2}$ is formed (deep into the substrate) a heavily doped p-type impurity region (not shown) which functions as a channel stopper.

Incidentally, on the further right side of the vertical transfer portion $3_{-2}$ are sequentially formed a reading gate, a light receiving portion, and a channel stopper (not shown). The above-mentioned components are repeated to form a line of pixels.

On the substrate 1 is formed an insulating film 4a of silicon oxide. On the insulating film 4a and above the vertical transfer portions $3_{-1}$ and $3_{-2}$ are formed transfer electrodes 5 of polycrystalline silicon.

The light receiving portion 2 performs photoelectric conversion to generate signal charges, which are read by the vertical transfer portion $3_{-1}$ through the reading gate. Thus, signal charges are sequentially transferred in one direction through the vertical transfer portion $3_{-1}$ as the transfer electrode 5 is driven by the 4-phase vertical transfer clock signals. Then, signal charges of each line are swept out by the horizontal transfer portion (not shown). Such signal charges are transferred through the horizontal transfer portion in synchronism with 2-phase horizontal clock signals. The transferred signals are finally output as image signals.

On the vertical transfer portions $3_{-1}$ and $3_{-2}$ and the light receiving portion 2 is formed a first interlayer dielectric which is composed of two layers 4b and 4c. On the first inter-layer dielectric 4c is formed a shielding film 6 of high-melting metal such as tungsten (W). The shielding film 6 has an opening 6a above the light receiving portion 2. The periphery 6a is positioned slightly inside the step of the first inter-layer dielectrics 4b and 4c which are formed by the edge of the vertical transfer portions $3_{-1}$ and $3_{-2}$. This structure causes the shielding film 6 to sufficiently shield the vertical transfer portions $3_{-1}$ and $3_{-2}$ from light, thereby suppressing smear.

A second inter-layer dielectric 7 is formed from PSG (Phosphosilicate glass) or BPSG (Borophosphosilicate glass) such that it covers the shielding film 6 and the first inter-layer dielectric 4c encircled by the opening 6a. In the surface of the second inter-layer dielectric 7 is formed a depression 7a which conforms to the step of the first inter-layer dielectric.

On the second inter-layer dielectric 7 is formed a convex lens 8 which has a prescribed curvature in the region above the light receiving portion 2 at the center of the depression 7a. This convex lens 8 is made of P-SiN or P-SiO$_2$ which has a sufficiently high light transmittance for a thickness of 1 to 2 μm.

The convex lens 8 is covered with a third interlayer dielectric 9 (referred to as planarized film) having a flat surface.

On the planarized film 9 is arranged an on-chip color filter (OCCF) 10. The OCCF 10 is colored in any of red (R), green (G), and blue (B) for the primary color coding system or in any of yellow (Ye), cyan (Cy), magenta (Mg), and green (G) for the complementary color coding system.

On the OCCF 10 is arranged an on-chip lens (OCL) 11 made of a light transmitting material such as negative-type photosensitive resin. Light incident on the convexly curved surface is converged by the OCL 11, and the converged light is further converged by the convex lens 8. The converged light finally hits the light receiving portion 2. The OCL 11 is formed on the surface of the solid-state imaging device in such a way that there is a minimum idle region. Thus, the OCL effectively condenses light hitting that part of the curved surface which is above the shielding film. This improves the sensitivity of the pixel.

The solid-state imaging device mentioned above is produced by the process which is explained below with reference to FIGS. 1A to 3B.

The step shown in FIG. 1A is designed to form impurity regions on the silicon substrate. First, a p-type well (or p-type impurity region) is formed on the surface of the silicon substrate by ion implantation as needed. The p-type impurity region is heavily doped by ion implantation to form a channel stopper. The light receiving portion 2 is formed by ion implantation with a p-type impurity at one side of the channel stopper. The vertical transfer portions $3_{-3}$ and $3_{-2}$ are formed by ion implantation with an n-type impurity at the other side of the channel stopper. The read gate is formed by ion implantation with an n-type impurity between the light receiving portion 2 and the vertical transfer portion $3_{-1}$ or $3_{-2}$.

The substrate on which impurity regions have been formed is covered with the insulating film 4a of silicon oxide by thermal oxidation or CVD. The insulating film 4a is coated by CVD with polycrystalline silicon which is incorporated with an impurity to increase conductivity. The layer of polycrystalline silicon is patterned to form the transfer electrode 5. The transfer electrode 5 and the light receiving portion 2 are covered with the first inter-layer dielectric consisting of two layers 4b and 4c made of silicon oxide or silicon nitride. On the first inter-layer dielectric 4c is formed by CVD a film of high-melting metal such as tungsten. This metal film is patterned to form the shielding film 6 which has an opening above the light receiving portion 2.

On the shielding film 6 and the opening 6a thereof is formed the PSG or BPSG film 7. Because of its inherently strong tendency to smoothing steps, the PSG or BPSG film 7 slightly fills the depression above the light receiving portion 2. This depression is due to the steps of the first inter-layer dielectric 4c and the shielding film 6. As the result, the PSG or BPSG film 7 forms a depression 7a in its surface above the light receiving portion 2, as show in FIG. 1B. If the depression 7a is excessively large, it may be made small by reflowing.

On the PSG or BPSG film 7 is formed the light transmitting film 8a (1 to 2 μm thick) from silicon nitride (P-SiN) or silicon oxide (P-SiO$_2$) by plasma CVD, as shown in FIG. 1C. The light transmitting film 8a formed in this way has a concave 8b formed in its surface. This concave 8b has a prescribed size conforming to the shape of the depression 7a in the PSG or BPSG film 7.

Figure 2A:
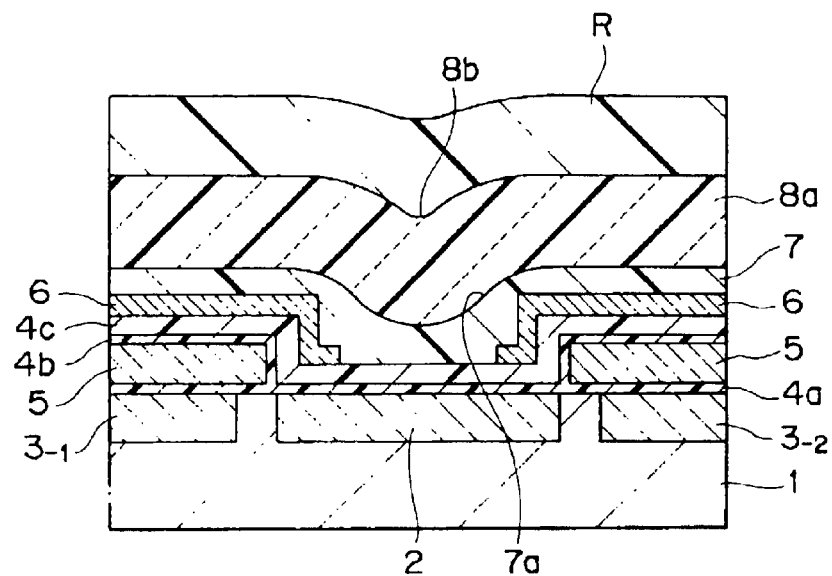
FIGS. 2A and 2B are sectional views showing the steps (up to formation of the resist pattern) in production of the solid-state imaging device pertaining to one embodiment of the present invention.
Figure 2B:
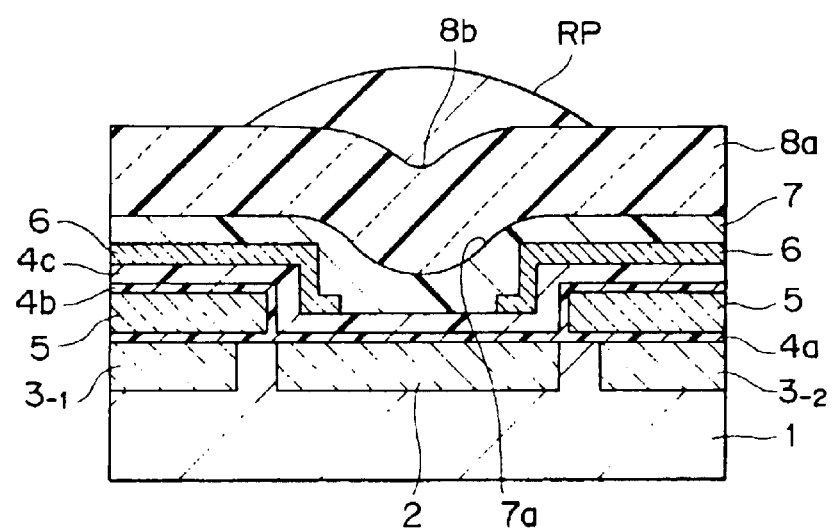

The light transmitting film 8a is coated with resist R (about 1 μm thick), as shown in FIG. 2A. The resist R is patterned in such a way that its central region remains. Patterning is followed by reflowing at 140 to 180° C., which softens the resist R, giving rise to the resist pattern RP which has a convexly curved surface with a desired curvature, as shown in FIG. 2B.

Then, etching is performed under the condition that the resist pattern RP and the light transmitting film 8a have almost the same selectivity. This etching causes periphery of the resist pattern RP to retreat. The rate of retreat gradually decreases as the periphery of the resist approaches the thick central part of the resist. Therefore, when etching is complete, the underlying light transmitting film 8a takes on a shape which conforms to the surface shape of the original resist pattern RP, as shown in FIG. 3A. As the result of etching, the light transmitting film 8a is made into the convex lens 8 which has almost the same curvature as the resist pattern RP. The convex lens 8 covers the light receiving portion 2 and that part of the shielding film 6 which surrounds the light receiving portion 2.

The entire surface of the light transmitting film 8a (including the convex lens 8) is covered with the planarizing film 9, so that the surface is made flat, as shown in FIG. 3B.

On the planarizing film 9 is formed the OCCF 10 by dyeing. Dyeing consists of coating with casein incorporated with a sensitizer, exposure, development, dyeing, and fixing. These steps are repeated for each color. Alternatively, the OCCF 10 may be formed by dispersion, printing, or electrodeposition.

Finally, the OCL 11 is formed from a negative-type photosensitive resin by etching in the same way as used for the convex lens 8. (This etching employs the rounded resist pattern as a mask.)

The advantage of forming the CCD solid-state imaging device as mentioned above is that the convex lens 8 has a small curvature even though the resist R is not sufficiently thin (or about 1 µm thick) The principle of this effect will be explained below with reference to FIG. 4. FIG. 4A–1 shows a resist pattern RP1 having a large curvature. FIG. 4A–2 shows a convex lens 81 formed by etching that employs the resist pattern RP1. FIG. 4B–1 shows a resist pattern RP2 having a small curvature. FIG. 4B–2 shows a convex lens $8_{-2}$ formed by etching that employs the resist pattern RP2.

The conventional process shown in FIGS. 4A–1 to 4B–2 has the following disadvantage because the convex lens is formed on a flat underlying surface. That is, for the convex lens $8_{-1}$ with a large curvature, the resist R1 may be comparatively thick as indicated by t1. By contrast, for the convex lens 82 with a small curvature, the resist R2 should be extremely thin as indicated by t2.

FIGS. 4C–1 and 4C–2 show the embodiment of the present invention in which the resist is formed on the underlying layer having the concave.

For the convex lens $8_{-3}$ shown in FIG. 4C–2, which has the same curvature as the convex lens $8_{-2}$ shown in FIG. 4B–2, the resist thickness t3 may be much larger than the resist thickness t2 (shown in FIG. 4B–1) if the underlying layer has the concave 8b. The reason for this is that when the resist concentrates at the center during heat treatment to round the resist, the surface curvature does not become excessively large owing to the concave in the underlying layer.

The above-mentioned embodiment, therefore, gives rise to a convex lens having a comparatively small curvature even though the resist is applied under a strict condition to prevent coating irregularity. In other words, owing to the depression 7a in the second inter-layer dielectric 7 (shown in FIG. 1B) and the concave 8b in the light transmitting film 8a (shown in FIG. 1C), the resist can be applied with a minimum of coating irregularity so that the convex lens 8 has the optimum curvature. Thus the convex lens has the identical shape in the same element or in the same wafer and the CCD imaging device has uniform light receiving characteristics.

In other words, the embodiment mentioned above makes it possible to improve sensitivity characteristics or smear characteristics (due to inadequate lens shape) under a certain strict condition that limits variation in the shape of convex lens.

Figure 5A:
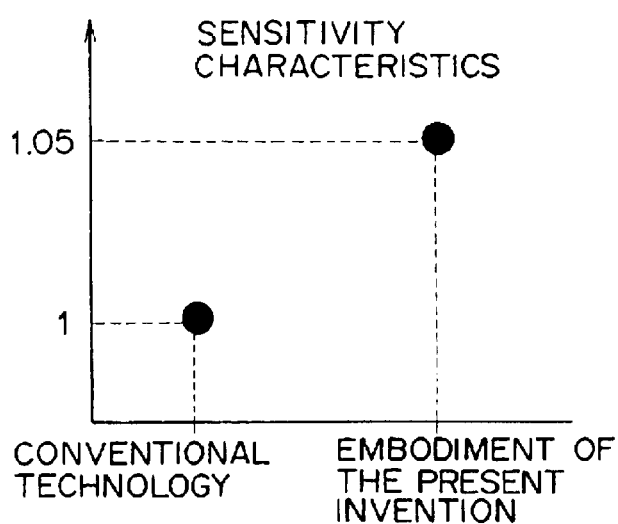
FIGS. 5A to 5C are diagrams each representing the sensitivity characteristics, the smear characteristics, and the number of pixels with decreased sensitivity in the conventional technology and the embodiment of the present invention, the data are comparative values with those in the conventional technology being unity.
Figure 5B:
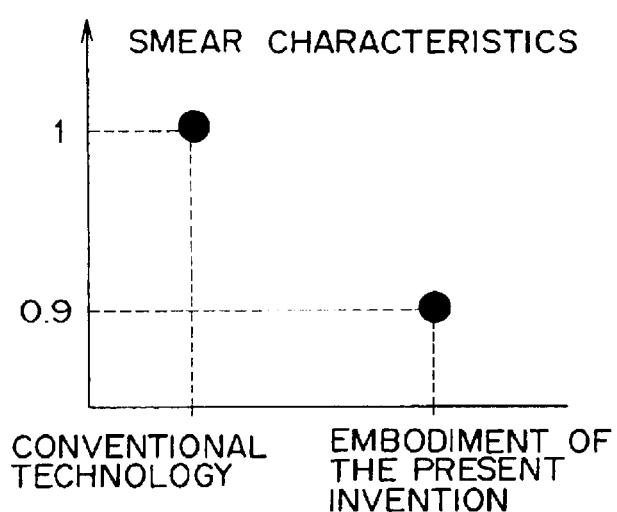
Figure 5C:
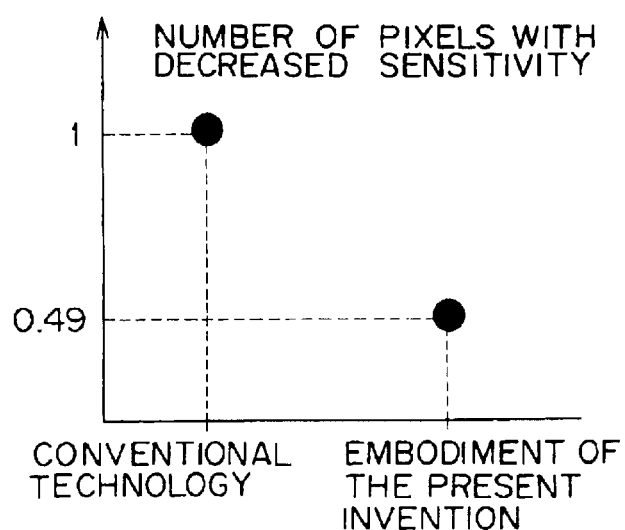
Figure 6A:
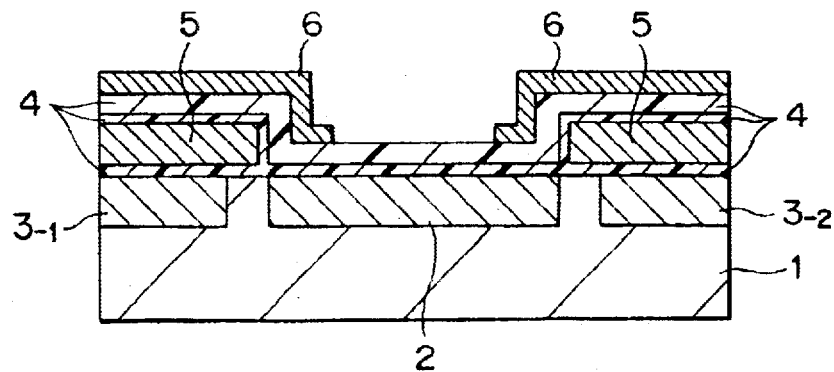
FIGS. 6A to 6C are sectional views showing the steps (up to formation of the light transmitting film) in production of the solid-state imaging device by "conventional process 1"
Figure 6B:
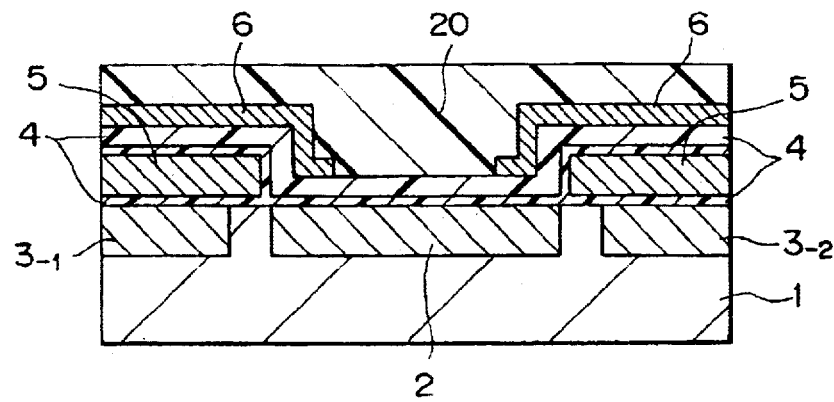
Figure 6C:
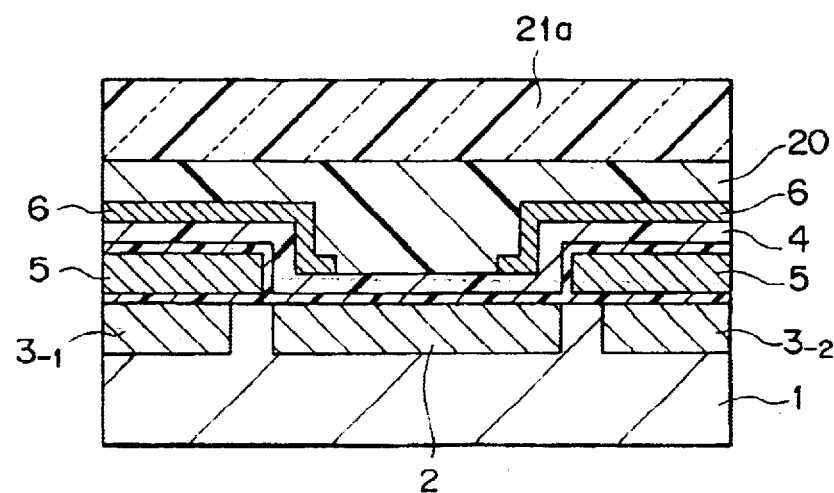
Figure 7A:
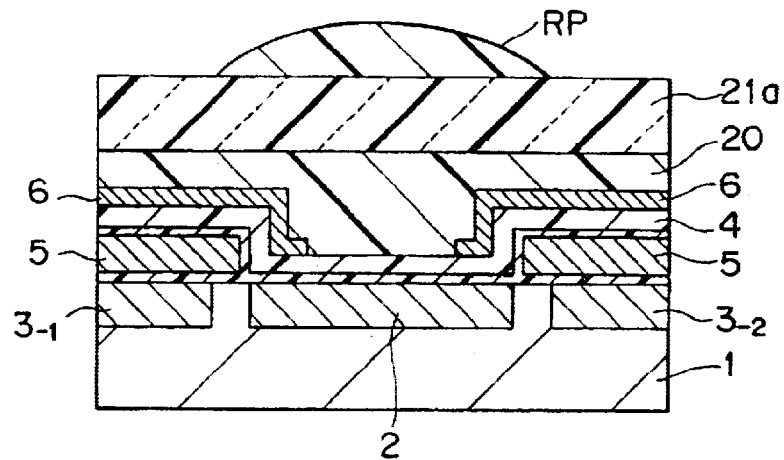
FIGS. 7A to 7C are sectional views showing the steps (up to formation of the OCL) in production of the solid-state imaging device by "conventional process 1"
Figure 7B:
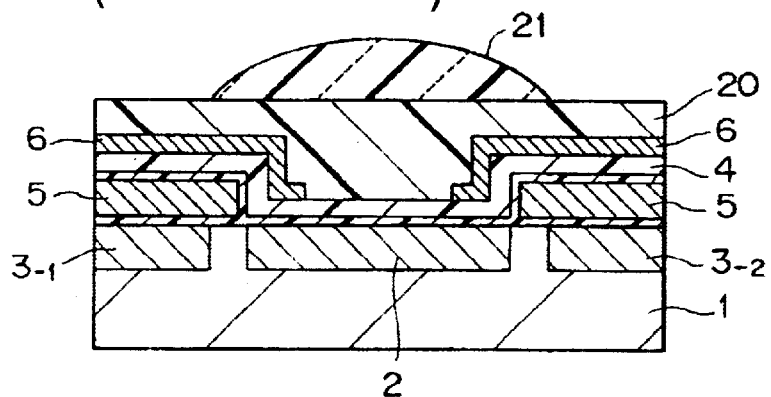
Figure 7C:
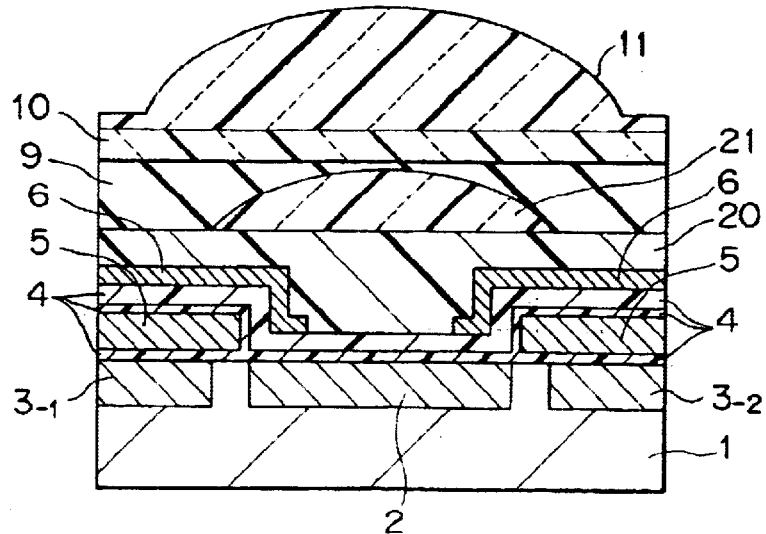
Figure 8A:
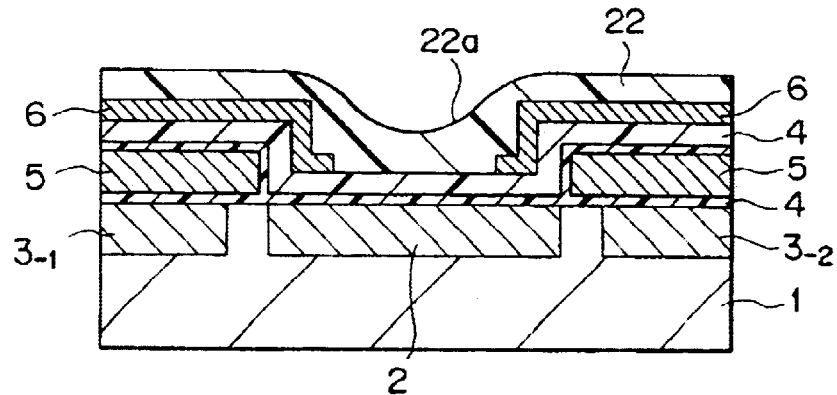
FIGS. 8A to 8C are sectional views showing the steps (up to formation of the lower part of the convex lens) in production of the solid-state imaging device by "conventional process 2"
Figure 8B:
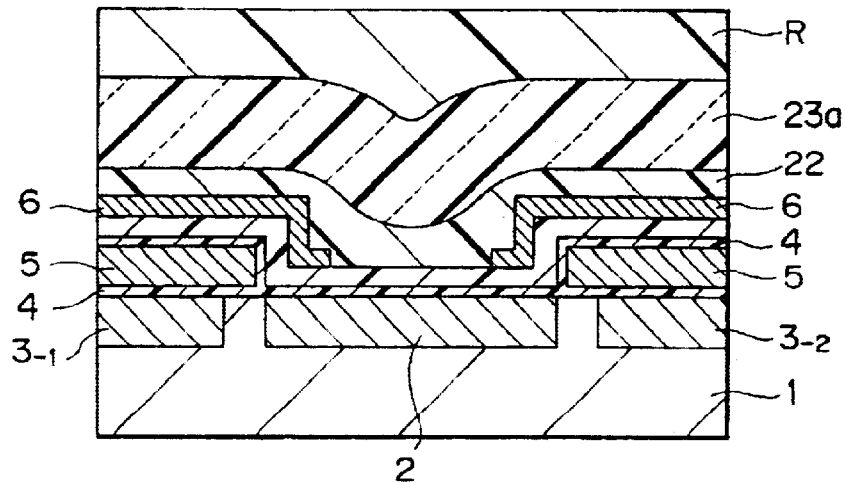
Figure 8C:
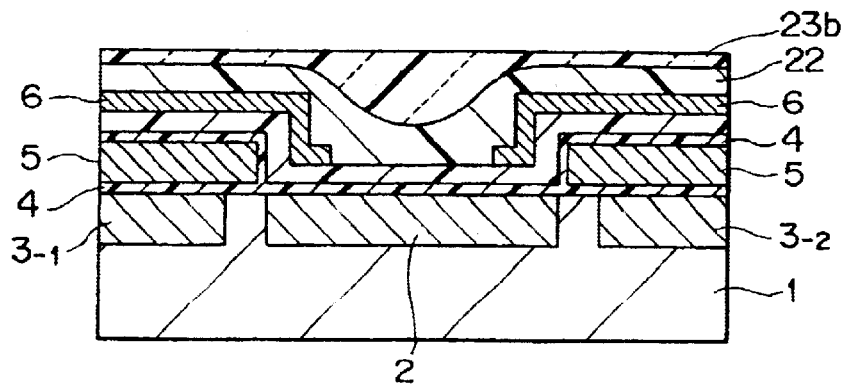
Figure 9A:
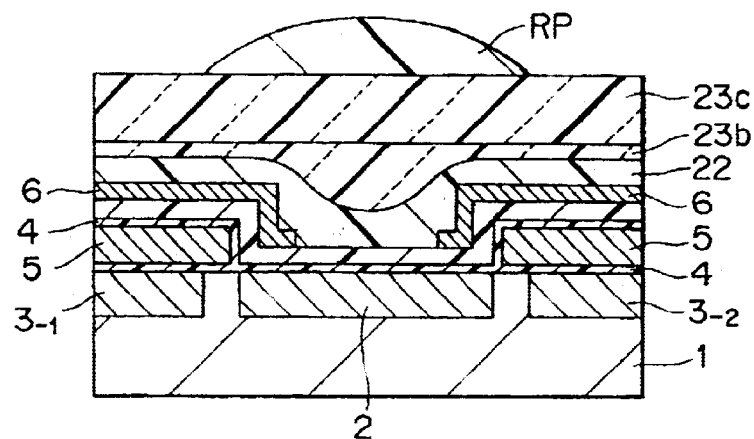
FIGS. 9A to 9C are sectional views showing the steps (up to formation of the OCL) in production of the solid-state imaging device by "conventional process 2"
Figure 9B:
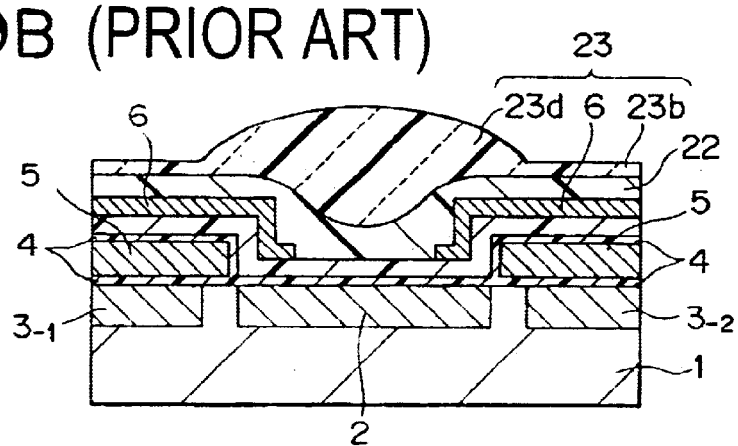
Figure 9C:
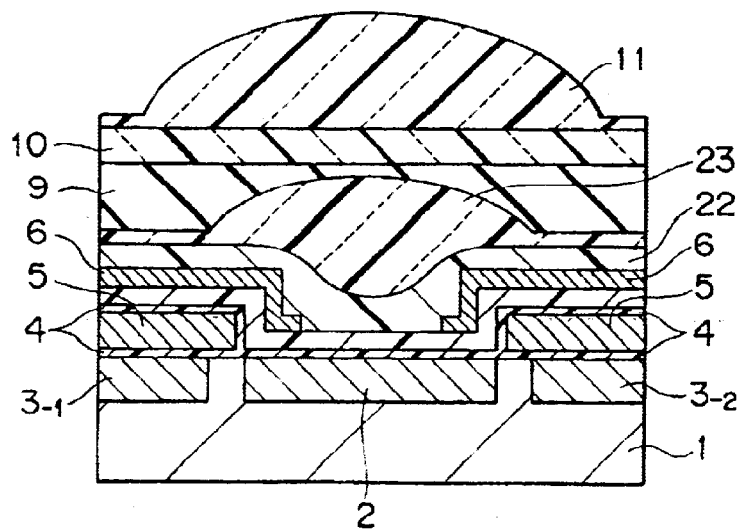
Figure 10:
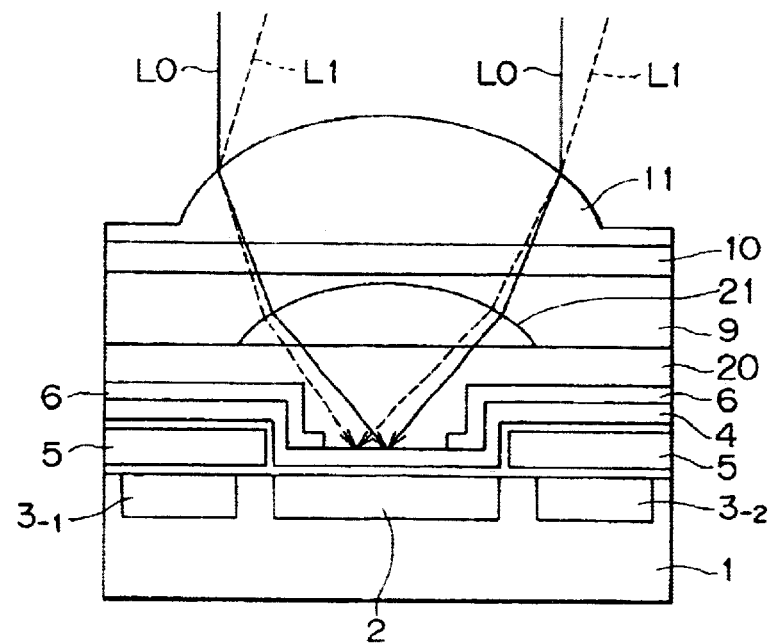
FIG. 10 is a diagram showing how light converges when the pixel size is comparative large in the solid-state imaging device formed by "conventional process 1"
Figure 11:
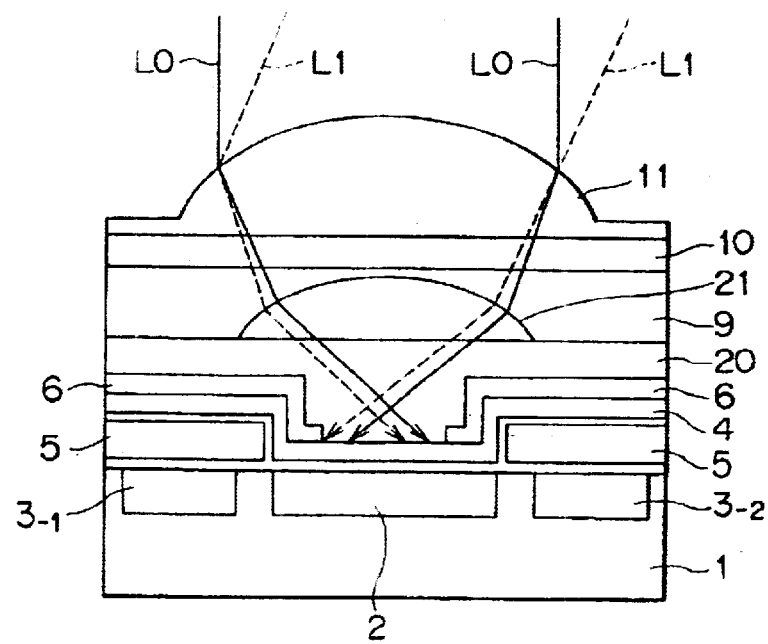
FIG. 11 is a diagram showing how light converges when the pixel size is comparative small in the solid-state imaging device formed by "conventional process 1".

FIGS. 5A to 5C show the sensitivity characteristics, the smear characteristics, and the number of pixels with decreased sensitivity in the conventional technology and the embodiment of the present invention. The data are comparative values, with those in the conventional technology being unity. The results were obtained from experiments with a CCD imaging device consisting of pixels each measuring about 3.5 by 3.5 µm. The comparative sample of the conventional technology is the CCD imaging device shown in FIG. 9C.

Incidentally, "conventional process 2" is identical with the embodiment of the present invention in that the convex lens is formed on the depression. However, the former needs two steps to form the light transmitting film and gives a flat surface as shown in FIG. 4B–1. This necessitates comparatively increasing the resist thickness, and the result is that the convex lens has a larger curvature than that in the embodiment of the present invention.

It is noted from FIGS. 5A to 5C that the embodiment of the present invention is superior to the conventional technology in sensitivity (increase by about 5% on average), smear (decrease by about 10%), and the number of pixels with decreased sensitivity (decrease by about 50%). Improvement in these characteristic properties suggests that the reduced curvature of the convex lens (of light transmitting film) improves the convergence of the incident light.

Incidentally, the process of producing the CCD imaging device according to the embodiment of the present invention obviates the necessity of planarizing the light transmitting film 8a on the PSG film or BPSG film 7 unlike "conventional process 2". Elimination of the planarizing step means that the light transmitting film can be formed by a single step. This leads to cost reduction.

The solid-state imaging device produced by the process of the present invention is characterized by the convex lens having a small curvature, which ensures uniform sensitivity and keeps sensitivity high for oblique incident light while preventing smears. In addition, the process of the present invention is simpler and more economical than "conventional process 2".

While the preferred embodiment of the present invention has been described using the specific terms, such description is for illustrative purposes only, and it is to be understood that changes and variations may be made without departing from the spirit or scope of the following claims.

What is claimed is:

1. An improved process for producing a solid-state imaging device comprising the steps of: forming a light-receiving portion of a pixel in a region of a substrate, forming a convex lens with an upwardly curved surface which is embedded in an inter-layer dielectric above said light-receiving portion, and forming an on-chip lens above said convex lens, wherein said improvement comprises forming sequentially said light-receiving portion, forming an inter-layer dielectric having a depression in its surface above said light-receiving portion, forming on said inter-layer dielectric a light transmitting film having in its surface a concave portion conforming to said depression, forming at a position that covers said concave portion on said light transmitting film a mask layer with a convexly curved surface without etching or planarizing the light transmitting film, and etching said mask layer and said light transmitting film all together, thereby making said light transmitting film into a lens.

2. A process for producing a solid-state imaging device as defined in claim 1, which further comprises, following the step of forming said light-receiving portion, the steps of forming electrodes to transfer charges generated by said light-receiving portion, said electrodes being positioned above both sides of said light-receiving portion and being insulated from said substrate, forming a shielding film which covers the charge transfer electrodes with an opening above said light-receiving portion, said shielding film being insulated from said charge transfer electrodes, and forming said inter-layer dielectric covering said shielding film and its opening in such a way that said depression is formed in the surface of said inter-layer dielectric.

3. A process for producing a solid-state imaging device as defined in claim 1, which further comprises, following the step of forming said light-receiving portion, the step of softening said inter-layer dielectric by heat treatment, thereby adjusting a depth of said depression.

4. A process for producing a solid-state imaging device as defined in claim 1, which further comprises the steps of forming a resist pattern as said mask layer on said light transmitting film and softening said resist pattern by performing a heat treatment, thereby adjusting a curvature of a surface of said resist pattern.

5. A process for producing a solid-state imaging device as defined in claim 1, wherein the etching step is carried out under the condition that said mask layer and said light transmitting film have almost the same selectivity.

* * * * *